United States Patent
Sander et al.

(10) Patent No.: US 7,012,984 B2
(45) Date of Patent: Mar. 14, 2006

(54) PLL NOISE SMOOTHING USING DUAL-MODULUS INTERLEAVING

(75) Inventors: Brian Sander, San Jose, CA (US); Earl W. McCune, Jr., Santa Clara, CA (US)

(73) Assignee: Tropian, Inc., Cupertino, CA (US)

( * ) Notice: Subject to any disclaimer, the term of this patent is extended or adjusted under 35 U.S.C. 154(b) by 0 days.

(21) Appl. No.: 10/095,738

(22) Filed: Mar. 11, 2002

(65) Prior Publication Data
US 2002/0126788 A1 Sep. 12, 2002

Related U.S. Application Data

(63) Continuation-in-part of application No. 09/362,670, filed on Jul. 29, 1999, now abandoned.

(51) Int. Cl.
*H03K 21/00* (2006.01)
(52) U.S. Cl. .......................... 375/376; 327/156; 331/25
(58) Field of Classification Search ................ 375/327, 375/373, 376; 327/147, 151, 156, 160, 105, 327/107, 117; 331/16, 25, 1 A; 377/48
See application file for complete search history.

(56) References Cited

U.S. PATENT DOCUMENTS

| | | | | |
|---|---|---|---|---|
| 4,121,162 A | * | 10/1978 | Alberkrack et al. ...... | 455/180.1 |
| 4,316,151 A | * | 2/1982 | Ooms ......................... | 331/1 A |
| 4,325,031 A | * | 4/1982 | Ooms et al. ................ | 331/1 A |
| 4,484,153 A | | 11/1984 | Borras et al. .................. | 331/10 |
| 4,573,023 A | * | 2/1986 | Cok et al. .................... | 331/1 A |
| 4,660,182 A | * | 4/1987 | Bates et al. ..................... | 367/3 |
| 4,891,774 A | * | 1/1990 | Bradley ....................... | 708/103 |
| 5,424,687 A | * | 6/1995 | Fukuda ......................... | 331/11 |
| 5,640,116 A | * | 6/1997 | Kobayashi et al. ......... | 327/231 |
| 5,867,068 A | * | 2/1999 | Keating ....................... | 331/1 A |
| 6,140,882 A | | 10/2000 | Sander | |
| 6,236,278 B1 | * | 5/2001 | Olgaard ....................... | 331/25 |
| 6,369,623 B1 | * | 4/2002 | Heinen ........................ | 327/117 |
| 6,411,669 B1 | * | 6/2002 | Kim ............................. | 377/48 |

OTHER PUBLICATIONS

Publication No. 404095, filed by Fox Enterprises, Inc., and Jet City Electronics, published on Sep. 2000, entitled "Programmable Crystal Oscillator", PPS 1-20.

* cited by examiner

*Primary Examiner*—Young T. Tse
(74) *Attorney, Agent, or Firm*—J. Davis Gilmer

(57) ABSTRACT

The present invention, generally speaking, achieves noise spreading within a PLL using a dual-modulus prescaler by interleaving the division moduli. Within a given cycle, "ones" and "tens" are not all counted consecutively. Instead, ones and tens are interleaved. In one embodiment of the invention, the R count is doubled and the output of the R counter is toggled between high and low states. (The Q counter may remain unmodified.) In another embodiment of the invention, ones and tens are interleaved in accordance with a ratio q:r. By so interleaving the modulus, the effect is to spread the noise resulting from the output signal of the dual-modulus prescaler over a wider frequency range. The prescaler noise level is greatly reduced, particularly within the frequency band of the reference frequency.

8 Claims, 12 Drawing Sheets

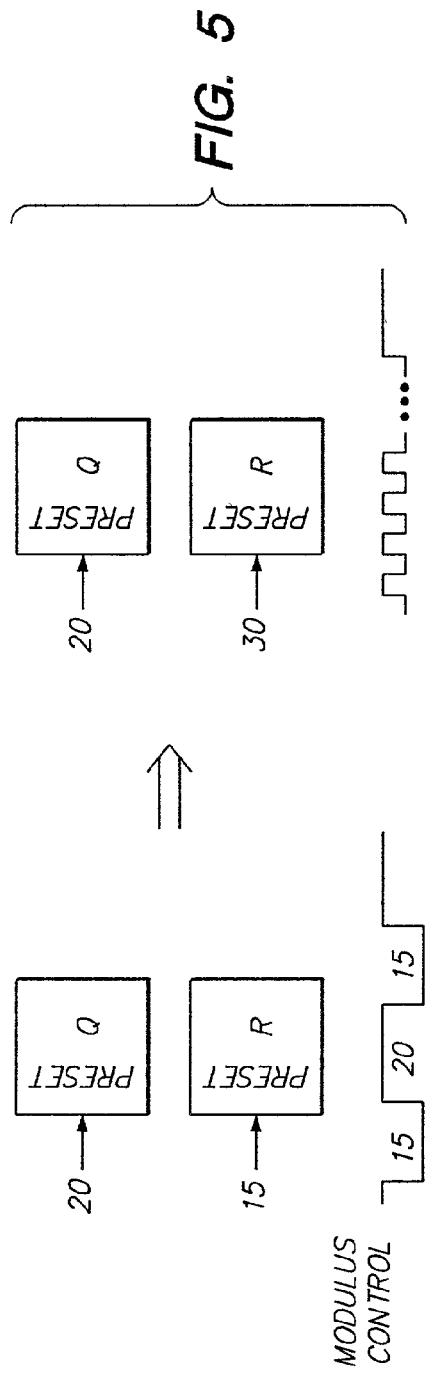
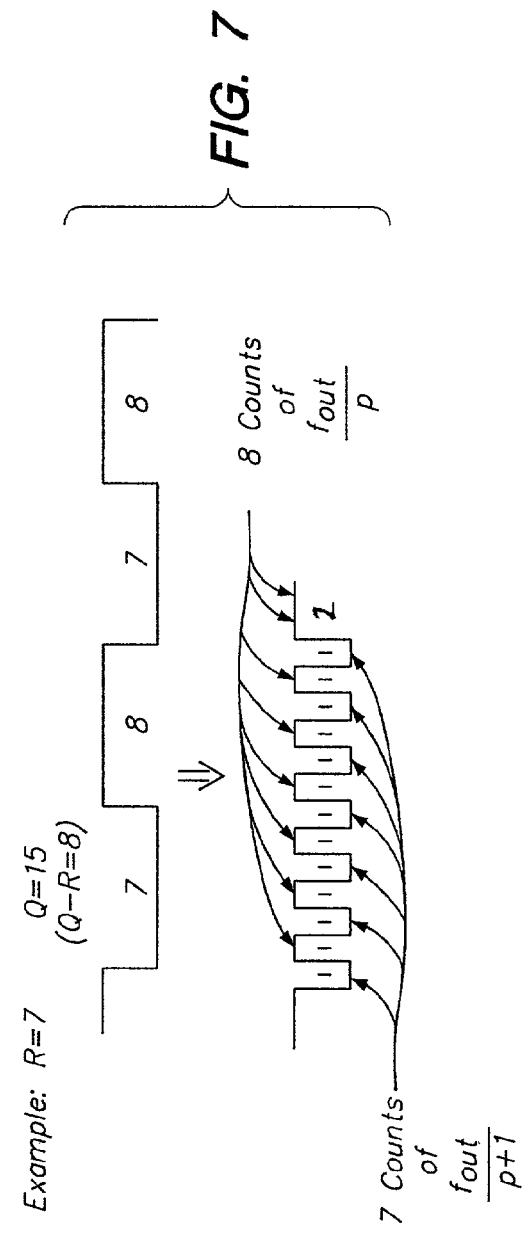

PLL NOISE SMOOTHING USING DUAL-MODULUS INTERLEAVING

RELATED APPLICATION

The present invention is a continuation-in-part (CIP) of U.S. patent application Ser. No. 09/362,670, now abandoned, of the same title filed Jul. 29, 1999, incorporated by reference.

BACKGROUND OF THE INVENTION

1. Field of the Invention

The present invention relates to phase locked loops (PLLs).

2. State of the Art

Practically all modem signal generators and radio communications equipment make widespread use of PLLs. A known PLL is shown in FIG. 1. A reference frequency $f_{in}$ is applied to a phase or phase/frequency detector, to which is also applied a feedback signal derived from an output frequency signal $f_{out}$ of the PLL. The detector produces an error signal, which is filtered by a loop filter. An output signal of the loop filter is applied to a voltage-controlled oscillator (VCO), which produces the output frequency signal $f_{out}$. Commonly, a programmable divide-by-N counter divides down the output frequency signal $f_{out}$ to produce a lower frequency signal that is then applied to the detector. In this manner, an output frequency signal can be generated that is some multiple of the reference frequency. Such divide-by-N counters are typically realized in CMOS.

At very high frequencies (such as those used in cellular radiotelephones), however, the speed capability of even the fastest CMOS circuit is quickly exceeded. In this instance, a dual-modulus prescaler is commonly used in which the difference between one divide modulus (P) and the other divide modulus (P+1) is one. In such an arrangement, shown in FIG. 2, a high-speed (e.g., ECL) dual-modulus counter is followed by a lower-speed (e.g., CMOS) programmable counter. The lower-speed counter controls which modulus of the dual-modulus prescaler is active at a given time via a modulus control signal MC. The use of multiple moduli enables a full range of effective divisors to be obtained.

One construction of such a circuit is shown in FIG. 3, in which the dual-modulus counter is followed by a pair of lower-speed (e.g., CMOS) programmable counters. In the circuit of FIG. 3, the reference and output frequencies are related as follows:

$$f_{out} = N \cdot f_{in}$$
$$= (QP + R)f_{in}$$
$$= ((Q - R)P + R(P + 1))f_{in}$$

where Q is the quotient of the integer division N/P and R is the remainder of the integer division N/P. The value Q is used to preset a "tens" counter (so-called because its effect is multiplied by the modulus P) and R is used to preset a "ones" counter (the effect of which is not multiplied by the modulus). The value Q must be greater than or equal to the value R. With this restriction, the minimum division ratio achievable to guarantee continuous coverage of the possible integer divisors N using such a circuit is, in general, P(P−1).

Assume, for example, that a 10/11 dual-modulus prescaler (P=10) is used and that a desired output frequency is 197 times the reference frequency. Using the foregoing formula, Q might be 19 and R might be 7. (Note that R<P always.) These values are preset into the respective counters. With a non-zero value loaded into the R counter, the dual-modulus prescaler is set to divide by P+1 at the start of the cycle. (The period of the cycle is given by the reciprocal of the reference frequency.) The output from the dual-modulus prescaler clocks both counters. When the R counter reaches zero, it ceases counting and sets the dual-modulus prescaler to divide by P. Only the Q counter is then clocked. Such a cycle is illustrated in FIG. 4. When the Q counter reaches zero, the initial values are again loaded into the counters and the next cycle begins.

In such a circuit, the modulus control signal for controlling the dual-modulus prescaler can generate considerable noise within the frequency band of the reference signal, since the period of this modulus control signal is equal to the period of the PLL reference signal. Various filtering strategies have been used to attack this problem. An effective, low-cost solution to this problem remains a long-standing need.

SUMMARY OF THE INVENTION

The present invention, generally speaking, achieves noise spreading within a PLL using a dual-modulus prescaler by interleaving the division moduli. Within a given cycle, "ones" and "tens" are not all counted consecutively. Instead, ones and tens are interleaved. In one embodiment of the invention, the R count is doubled and the output of the R counter is toggled between high and low states. (The Q counter may remain unmodified.) In another embodiment of the invention, ones and tens are interleaved in accordance with a ratio q:r. By so interleaving the modulus, the effect is to spread the noise resulting from the output signal of the dual-modulus prescaler over a wider frequency range. The prescaler noise level is greatly reduced, particularly within the frequency band of the reference frequency.

BRIEF DESCRIPTION OF THE DRAWING

The present invention may be further understood from the following description in conjunction with the appended drawing. In the drawing:

FIG. 5 is a diagram illustrating the principle of the invention in accordance with one embodiment thereof;

FIG. 7 is a timing diagram illustrating operation of the PLL of FIG. 6;

DETAILED DESCRIPTION OF THE PREFERRED EMBODIMENTS

The modulus interleaving technique of the present invention may be applied in various forms with varying degrees of sophistication and complexity. A simple but effective implementation of modulus interleaving is illustrated in FIG. 5. In this implementation, the Q count and the Q counter are left unchanged. The R count is doubled, and the R counter is toggled. For example, if the R count would normally be 15 with the counter output being held low for 15 counts, instead the count is doubled to 30. The counter output, instead of being held low continuously, is toggled, i.e., low for 1 count, high for 1 count, low for 1 count, etc. The overall effect is the same as in the conventional case—referring again to the foregoing equations, the effect is to replace R with 2R/2. The difference is that the energy spectrum of the modulus control signal is shifted above and away from the PLL reference frequency. If desired, the same measure may be taken with respect to Q. In general, R (and Q, if desired) may be replaced by mR/m, where m is the number of moduli of the prescaler. For a dual modulus prescaler, m=2.

Figure 6:
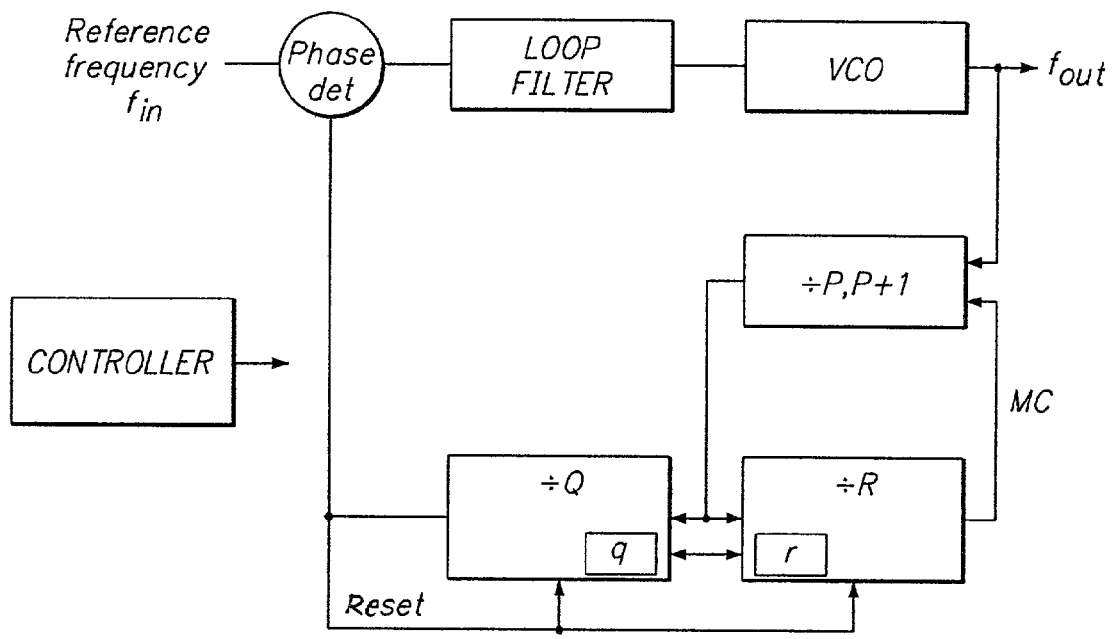
FIG. 6 is a block diagram of a PLL in accordance with one aspect of the present invention.

In other arrangements, it may be advantageous to be able to control the distribution of pulses within the modulus control signal. Referring now to FIG. 6, a block diagram is shown of a PLL circuit in accordance with another embodiment of the present invention. As compared to the PLL circuit of FIG. 3, the R counter and the Q counter are modified by the addition of an r counter and an q counter, respectively. The resulting R counter counts R total counts, r at a time. The resulting Q counter counts Q total counts, q at a time. In accordance with an exemplary embodiment, the apparatus operates in the following manner.

As in the prior art circuit, with a non-zero value loaded into the R counter, the dual-modulus prescaler is set to divide by P+1 at the start of the cycle. The output from the dual-modulus prescaler clocks both counters. When the r counter reaches zero, the R counter ceases counting and sets the dual-modulus prescaler to divide by P. Only the Q counter is then clocked. When the q counter reaches zero, the initial values r and q are again loaded into the counters and the next subcycle begins. During the final subcycle, the R counter counts down to zero, after which the Q counter counts down to zero. Such operation is illustrated in FIG. 7, with (R, r)=(7, 1) and (Q, q)=(8, 1). Note that r and q need not be one; the only requirements are that R≦Q, r≦R, and q≦Q. (The case r=R and q=Q represents the conventional operating method.)

Figure 1:
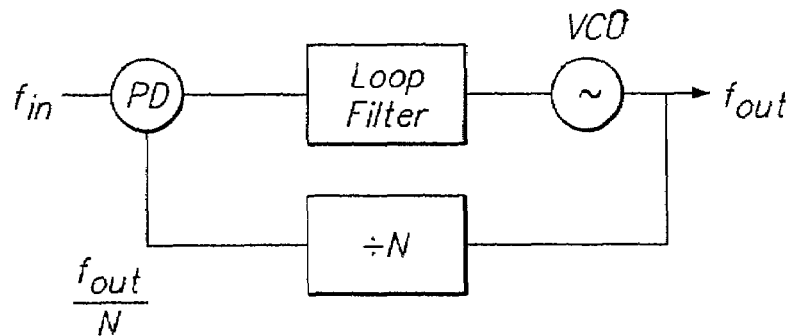
FIG. 1 is a block diagram of a conventional PLL using a divide-by-N counter.
Figure 2:
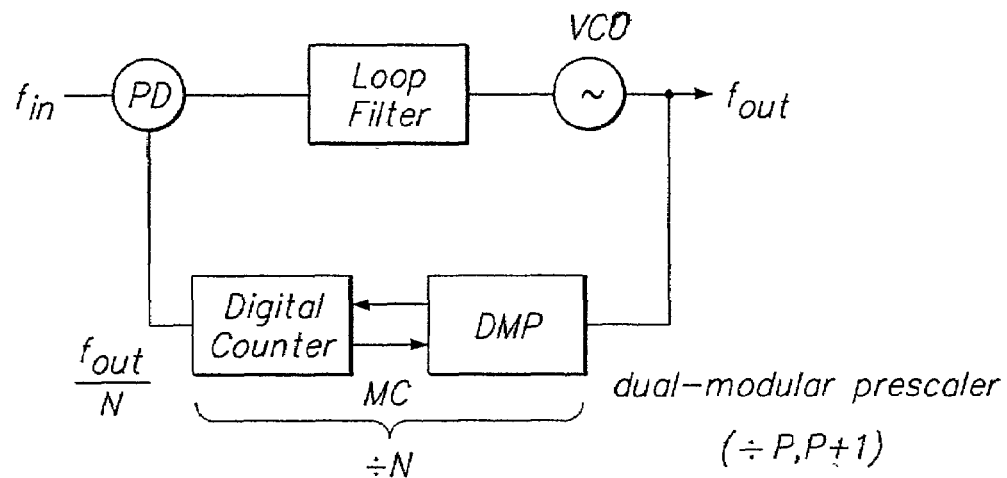
FIG. 2 is a block diagram of a conventional PLL using a dual-modulus prescaler.
Figure 4:
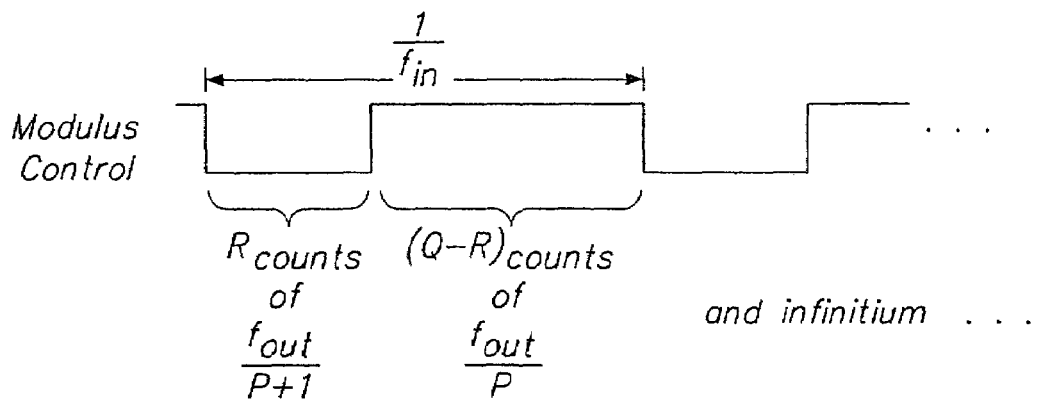
FIG. 4 is a timing diagram illustrating operation of the PLL of FIG. 2.
Figure 8:
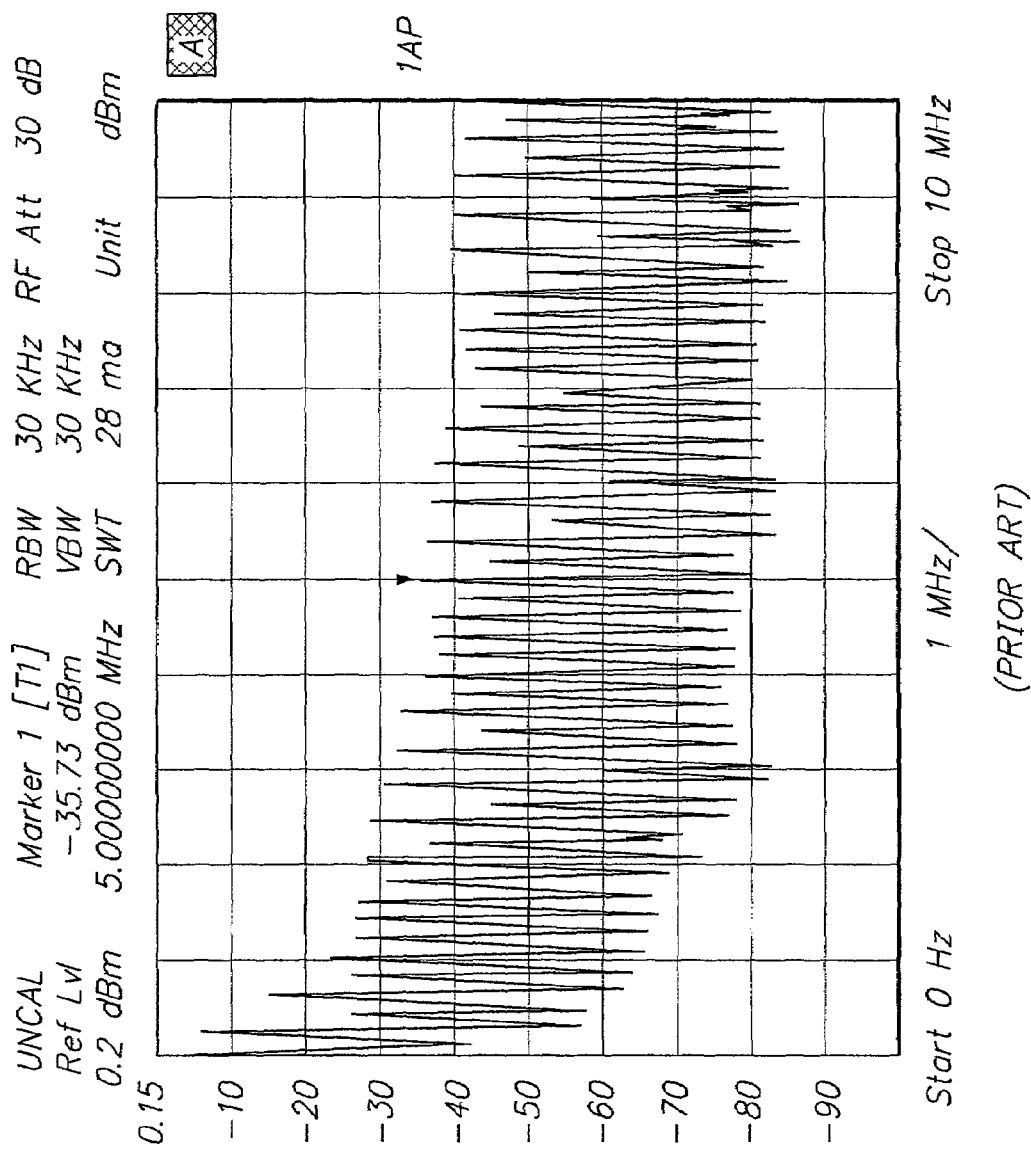
FIG. 8 is a waveform display showing noise levels using a conventional PLL circuit.
Figure 9:
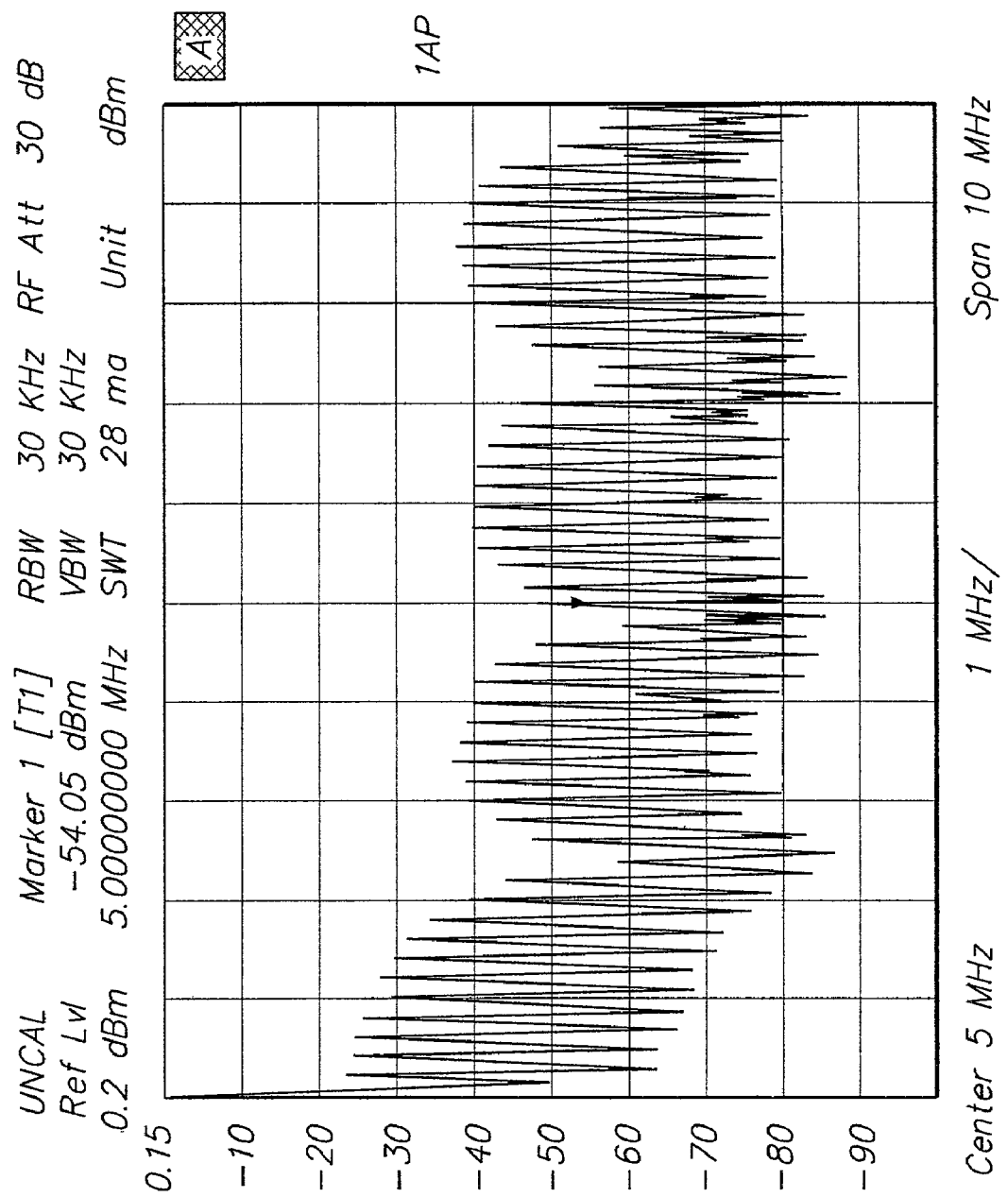
FIG. 9 is a waveform display showing noise levels using the present PLL circuit.

The noise spreading effect of the present modulus interleaving technique may be observed by comparing FIG. 8 and FIG. 9. FIG. 8 is a plot of the energy within the signal present on the modulus control line in accordance with the traditional modulus control setup of FIGS. 3 and 4. Excluding zero hertz, the noise margin at the first noise peak is about −25 dbm. FIG. 9 is a plot of the energy within the signal present on the modulus control line in accordance with the present modulus control setup of FIGS. 6 and 7. Excluding zero hertz, the noise margin at the first noise peak is about −25 dbm. Thus, this example demonstrates a reduction in the noise from the modulus control signal at the reference frequency of 20 dB. Note that there are no additional components or extra filtering required by this method. There is essentially no increase in the cost of a PLL incorporating the present invention. Note further that this interleaving is readily expanded to higher order multi-modulus prescaling, such as 3-modulus and 4-modulus prescalers.

Figure 10:
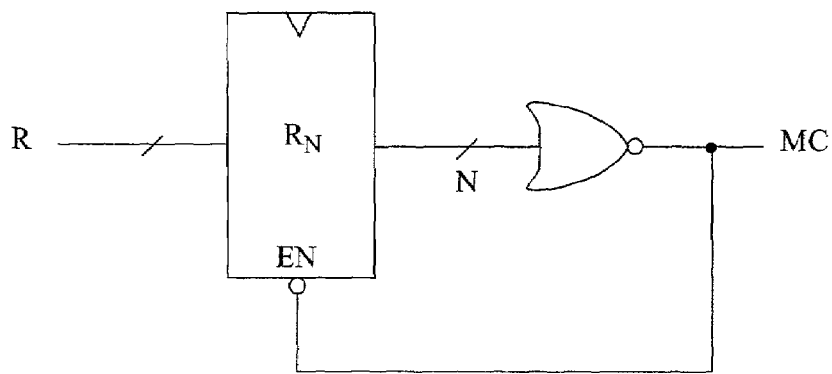
FIG. 10 is a diagram of a conventional programmable counter.

Referring to FIG. 10, conventionally, the programmable R counter may be realized in the form of an N-bit down counter and an N-bit NOR gate. The N-bit output count of the counter is coupled to the N inputs of the NOR gate. An output signal of the NOR gate provides the modulus control signal MC, which is fed back to an enable input of the counter.

In operation, with the value R loaded in the counter, the counter begins counting down in accordance with the clock signal S. For so long as the count is non-zero, at least one of the inputs to the NOR gate will have a high level, causing the output signal of the NOR gate to remain low. Once the count reaches zero, the output signal of the NOR gate transitions high, and the counter is disabled until such time as the counter is reloaded with the value R.

Figure 11:
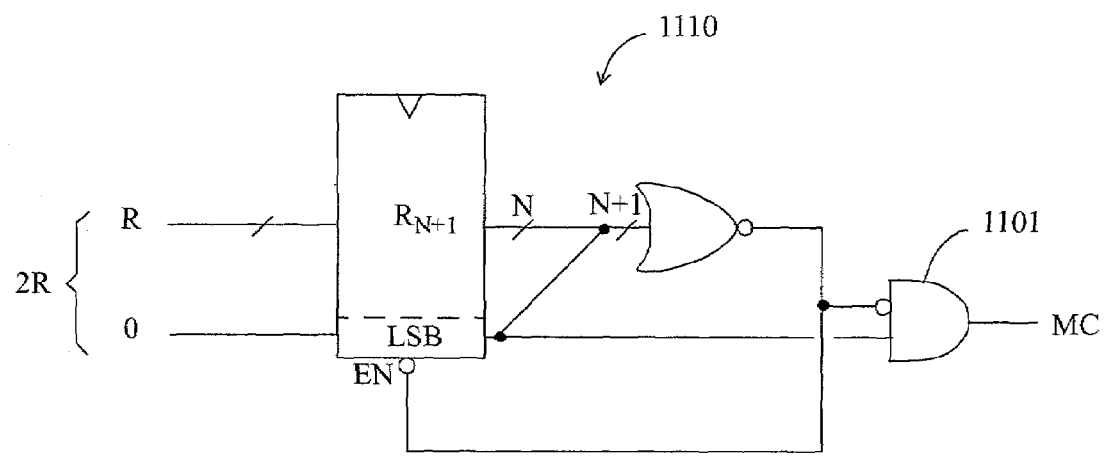
FIG. 11 is a diagram of a programmable counter that may be used with the present invention.

For use with the present invention, the programmable counter may be modified as shown in FIG. 11. As in the conventional circuit (FIG. 10), a counter and a NOR gate may be used. However, both these devices are N+1-bit devices, allowing for a count of 2R instead of R. (The value 2R may be formed from the value R by appending an additional zero as the least-significant bit.) Toggling of the modulus control signal is achieved by adding together the counter output signal LSB and the output signal of the NOR gate using an AND gate 1101. As the LSB of the counter toggles, counting down even and odd values alternately, the modulus control signal also toggles, until the terminal count (all zeros) is reached. The modulus control signal then remains low, and the counter is disabled until such time as the counter is reloaded with the value R.

Figure 3:
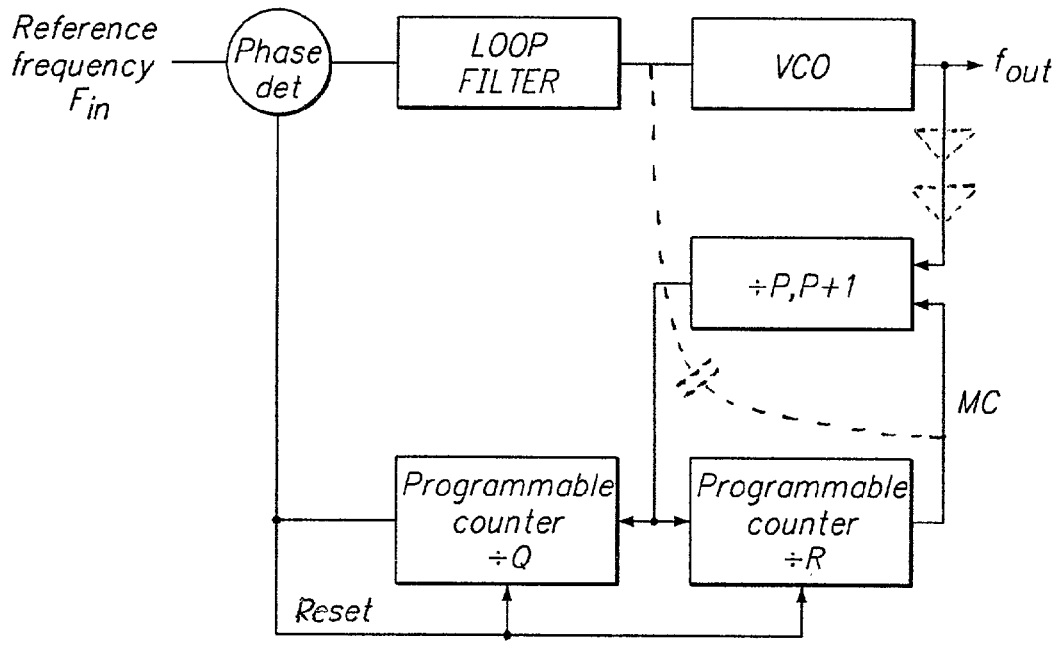
FIG. 3 is a more detailed block diagram of one realization of the circuit of FIG. 2.
Figure 12:
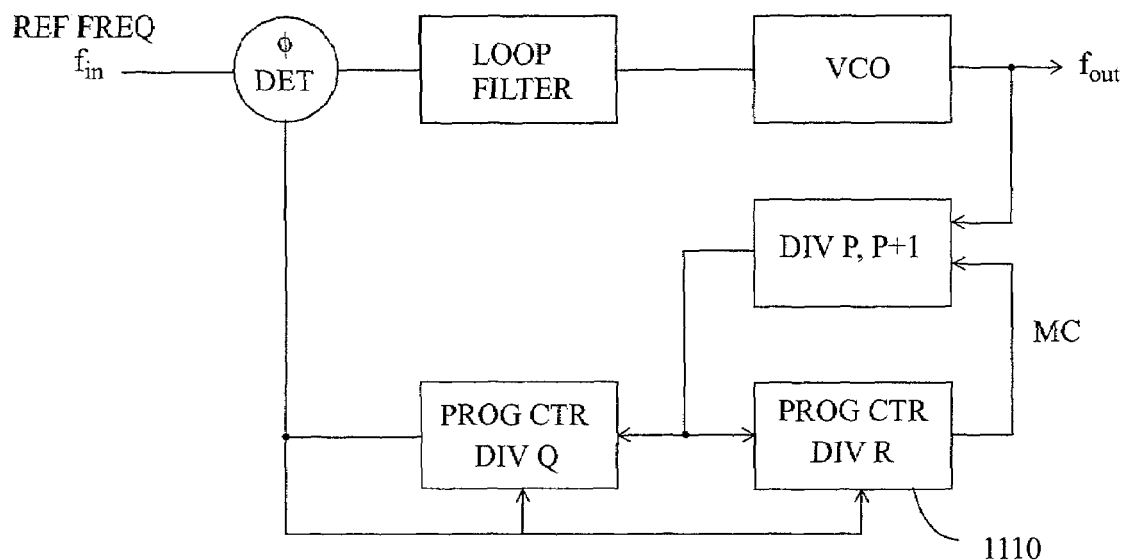
FIG. 12 is a diagram of a circuit like that of FIG. 3 but where the counter circuit of FIG. 11 is used instead of the counter circuit of FIG. 10.

FIG. 12 illustrates a circuit like that of FIG. 3 but using the programmable counter of FIG. 11 to achieve toggling of the modulus control signal.

Figure 13:
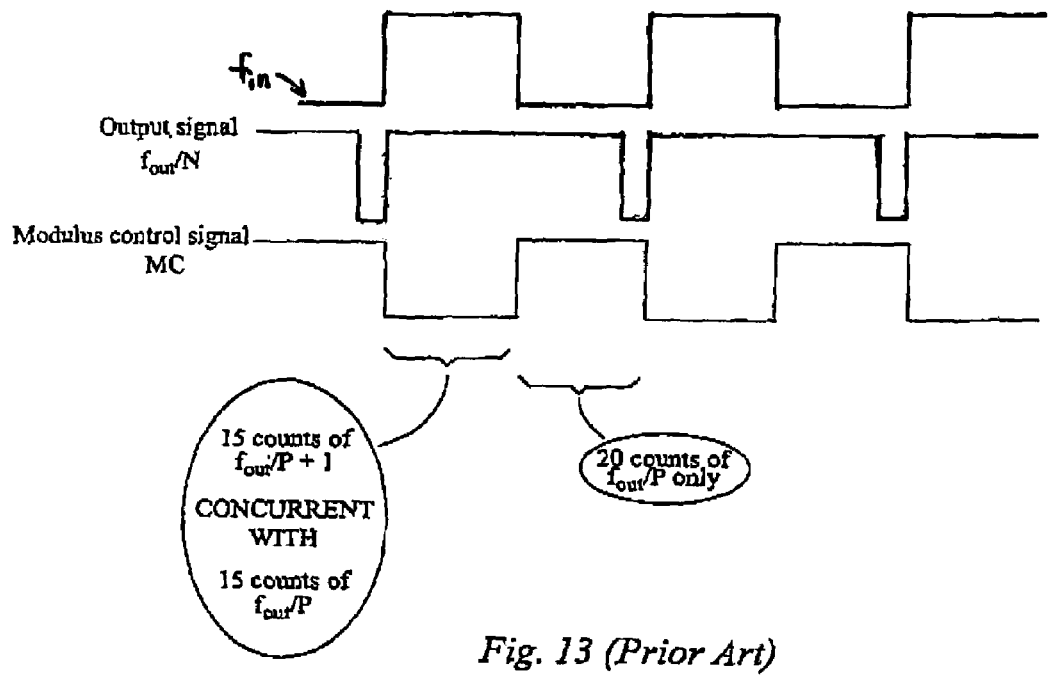
FIG. 13 is a timing diagram illustrating operation of a conventional dual-modulus counter.
Figure 14:
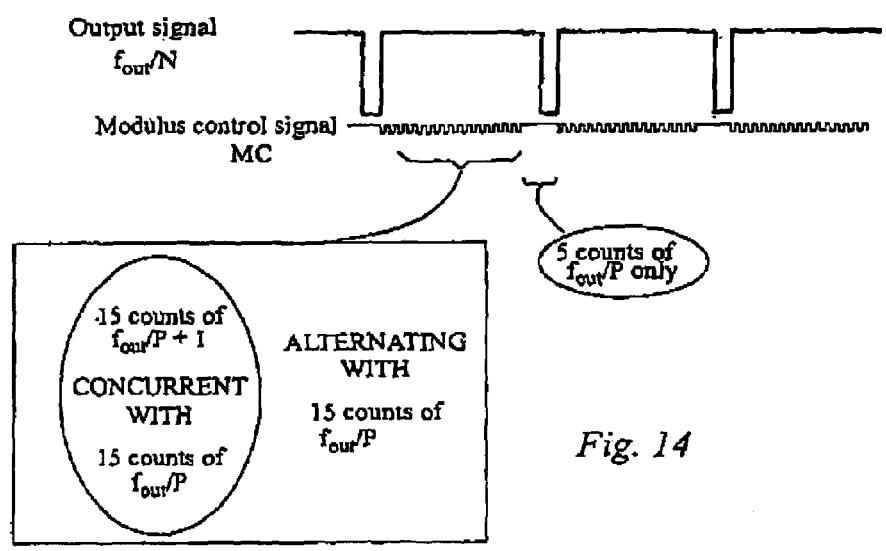
FIG. 14 is a timing diagram illustrating operation in accordance with dual-modulus interleaving.

FIGS. 13 and 14 contrast operation of the prior art circuit of FIG. 3 with that of the circuit of FIG. 12 for the case Q=35, R=15 (2R=30). As seen in FIG. 13, in the prior art the modulus control signal always transitions exactly two times per period of $f_{out}/N$, regardless of the particular values of Q and R. As seen in FIG. 14, by contrast, the modulus control signal transitions many more times per period of $f_{out}/N$ than the required number of two.

Figure 15:
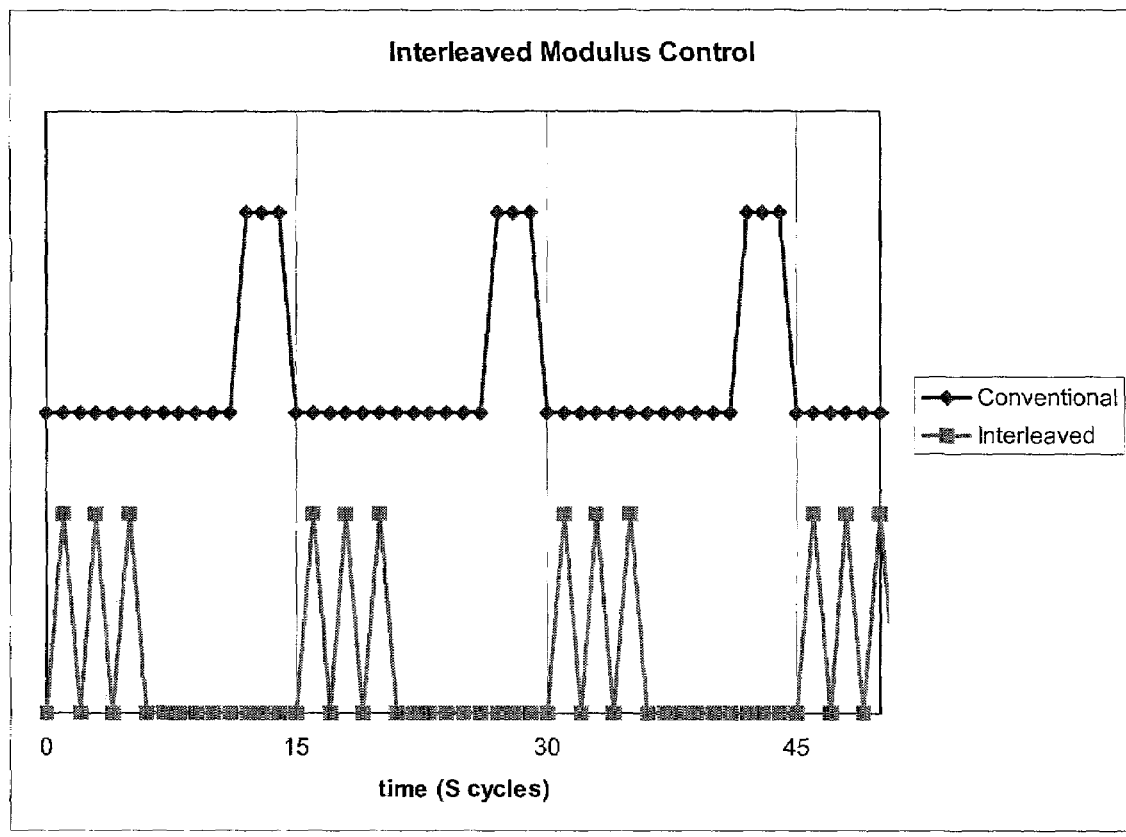
FIG. 15 is a timing diagram illustrating operation of the embodiment of FIG. 3 where Q<<2R.
Figure 16:
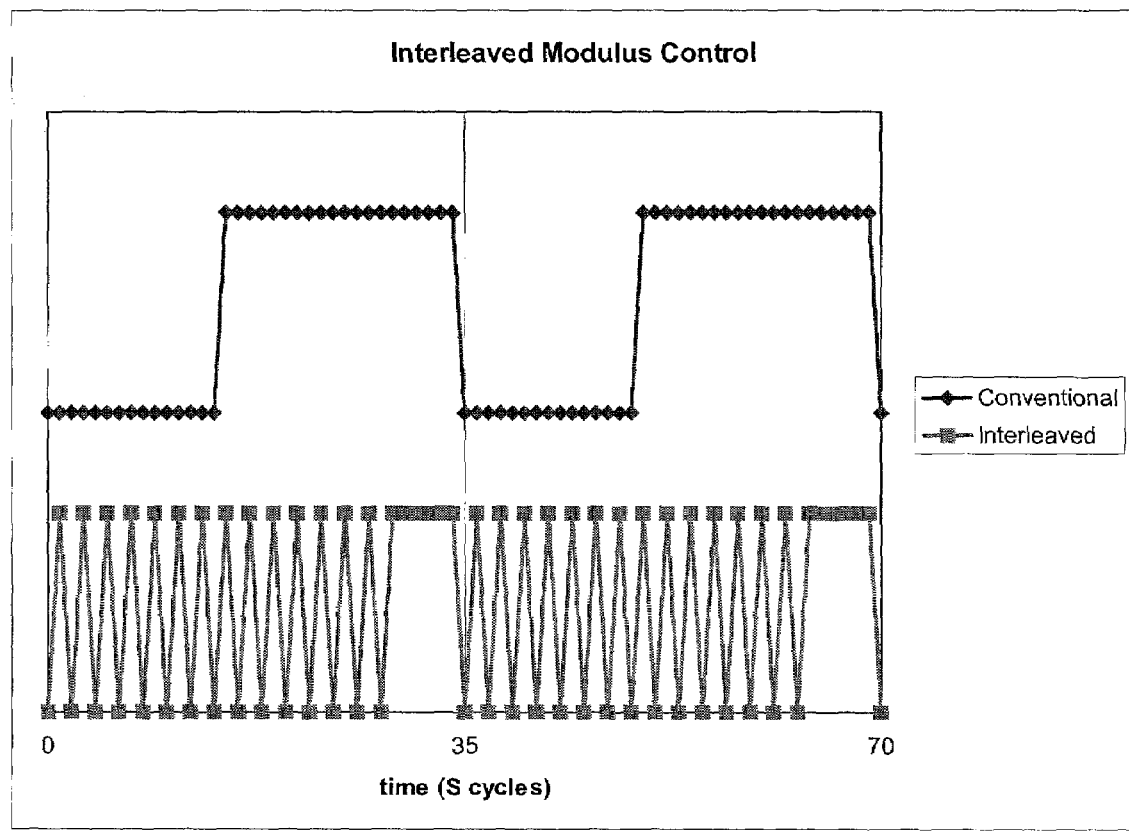
FIG. 16 is a timing diagram illustrating operation of the embodiment of FIG. 3 where Q>2R.

Further examples of operation of the embodiment of FIG. 12 are shown in FIG. 15 and FIG. 16, corresponding to the conditions Q<2R (P=16, Q=15, R=12) and Q>2R (P=64, Q=35, R=15), respectively. The upper waveform of these figures shows the modulus control signal as it would be conventionally, and the lower waveform shows the modulus control signal in accordance with dual-modulus interleaving.

Note again the characteristic pattern in which the modulus control signal transitions many more times than the required number of two.

The embodiment of FIG. 12 is limited to the case where Q−R>0. Although this is commonly the case, it is not always so. A more general embodiment is shown in FIG. 6. The embodiment of FIG. 6 works for all cases and allows the pulses of the modulus control signal to be evenly distributed.

Figure 17:
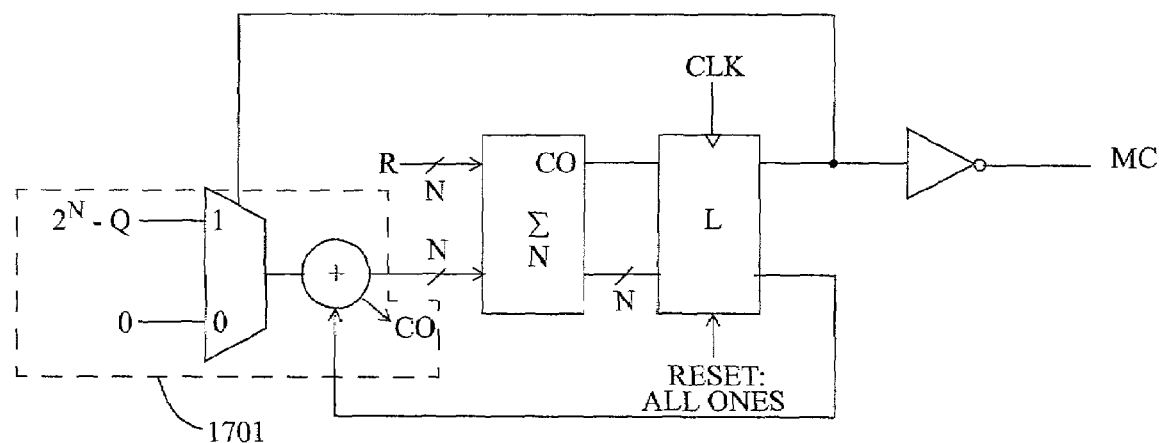
FIG. 17 is a diagram of a circuit in accordance with another embodiment of the invention.

A rather more elegant way of evenly distributing pulses of the modulus control signal may be achieved by using the circuit of FIG. 17. Here, an accumulation structure is used (as described, for example, in U.S. Pat. No. 5,053,982, incorporated herein by reference), having an N-bit full Σ and an N+1-bit latch L clocked by the signal S. The value R is applied as an addend to one input of the adder. At the other input of the adder, a selector/jump circuit 1701 is provided, composed of a multiplexer and an adder. One input to the multiplexer is zero, and the other input is the value $2^N-Q$. The output of the multiplexer forms one input to the adder, and the contents of the latch, excluding the carry signal, form the other input to the adder. The latched carry output provides a select signal for controlling the multiplexer.

Figure 18:
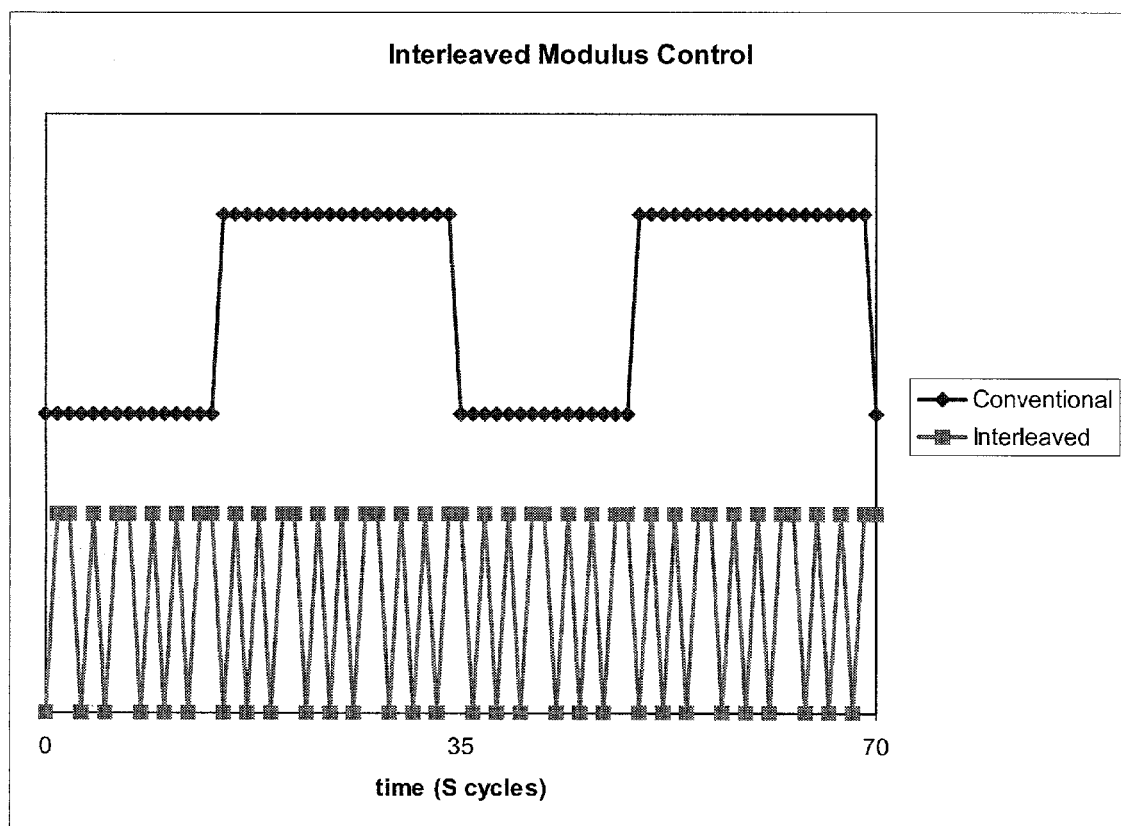
FIG. 18 is a timing diagram illustrating operation of the circuit of FIG. 17.

Operation of the circuit of FIG. 17 may best be appreciated in accordance with an example. Operation of the circuit of FIG. 17 is illustrated in FIG. 18 for the case of N=64, Q=35, R=15. Assume that Q=35, R=15 and N=6($2^N$=64, $2^N$−Q=29). In the reset state, the N LSBs of the latch L contain the value $2^N-1$ (all ones), in this instance 63. The latched carry output is also set to 1. In this condition, MC is low; the selector/jump circuit is set to select $2^N-Q$. At the next clock signal, the N-bit latched value (63) is added together with $2^N-Q$(29), and the result (MOD 64(92)=28) is added together with R (15) to give MOD 64(107)=43 with zero carry (CO=0). (In the remaining description, addition will be assumed to be MOD 64.) The MC signal therefore goes high. At the next clock signal, 43 is added together with 0 to give 43, which is in turn added together with 15 to give 58 (CO=0). At the next clock signal, 58 is added together with 0 to give 58, which is in turn added together with R (15) to give 9 with CO=1. The modulus control signal therefore goes low. At the next clock signal, 9 is added together with $2^N-Q$ (29) to give 38, which is in turn added together with 15 to give 53 (CO=0).

Operation continues in this manner, resulting in the following sequence of states:

| Clock cycle | L (without MSB) | MC |
|---|---|---|
| 0 | 63 | 0 |
| 1 | 43 | 1 |
| 2 | 58 | 1 |
| 3 | 9 | 0 |
| 4 | 53 | 1 |
| 5 | 4 | 0 |
| 6 | 48 | 1 |
| 7 | 63 | 1 |
| 8 | 14 | 0 |
| 9 | 58 | 1 |
| 10 | 9 | 0 |
| 11 | 53 | 1 |
| 12 | 4 | 0 |
| 13 | 48 | 1 |
| 14 | 63 | 1 |
| 15 | 14 | 0 |
| 16 | 58 | 1 |
| 17 | 9 | 0 |
| etc. | etc. | etc. |

It will be appreciated by those of ordinary skill in the art that the invention can be embodied in other specific forms without departing from the spirit or essential character thereof. The presently disclosed embodiments are therefore considered in all respects to be illustrative and not restrictive. The scope of the invention is indicated by the appended claims rather than the foregoing description, and all changes which come within the meaning and range of equivalents thereof are intended to be embraced therein.

What is claimed is:

1. A method of operating a frequency divider that performs frequency division of an applied signal by a factor N, which is an integer greater than or equal to one, to produce an output signal, the frequency divider including a multiple-modulus prescaler controlled by a modulus control signal, the method comprising:
   causing the modulus control signal to transition greater than two times per period of the output signal to obtain division by N;
   whereby noise energy produced by transitions of the modulus control signal is moved away from a frequency band of the output signal.

2. The method of claim 1, further comprising:
   deriving a reduced-frequency signal; and
   toggling the modulus control signal in accordance with transitions of the reduced-frequency signal.

3. The method of claim 1, further comprising:
   distributing transitions of the modulus control signal occurring during one period of the output signal substantially evenly throughout that period of the output signal.

4. A frequency divider that performs division of an applied signal by a factor of N, which is greater than or equal to one, to produce an output signal, comprising:
   a multiple-modulus prescaler controlled by a modulus control signal; and
   a counter circuit coupled to the multiple-modulus prescaler and used to produce the modulus control signal, the counter circuit including control means for causing the modulus control signal to transition greater than two times per period of the output signal;
   whereby noise energy produced by transitions of the modulus control signal is moved away from a frequency band of the output signal.

5. The frequency divider of claim 4, wherein the multiple-modulus prescaler derives a reduced-frequency signal, said control means toggling the modulus control signal in accordance with transitions of the reduced-frequency signal.

6. The frequency divider of claim 4, wherein said control means distributes transitions of the modulus control signal occurring during one period of the output signal substantially evenly throughout that period of the output signal.

7. A phase locked loop, comprising:
   a phase detector having a first input configured to receive a reference frequency signal;
   a voltage controlled oscillator (VCO) operable to produce an output frequency signal;
   a loop filter disposed between an output of the phase detector and an input of the VCO; and
   a frequency dividing circuit coupled between an output of the VCO and a second input of the phase detector, the frequency dividing circuit having:
      a multiple-modulus prescaler;
      a first counter coupled to the multi-modulus prescalar that counts R total counts r at a time;
      a second counter coupled to the multi-modulus prescalar that counts Q total counts q at a time; and
      a control circuit for repeatedly selecting in turn a first modulus for r counts and a second modulus for q counts,
      wherein R, r, Q and q are integers and r is an integer that does not equal R.

8. A circuit, comprising:
- a multi-modulus prescalar having a multi-modulus control input;
- a first counter operable to divide a signal by a first modulus for a first period of time and generate a multi-modulus control signal that is coupled to the multi-modulus control input of the multi-modulus prescalar; and
- a second counter operable to divide said signal by a second modulus for a second period time after said first period of time expires,
- wherein said multi-modulus control signal is repeatedly toggled between high and low states during said first period of time.

* * * * *